United States Patent
Pelella et al.

(10) Patent No.: US 11,005,263 B2
(45) Date of Patent: May 11, 2021

(54) ELECTRO-STATIC DISCHARGE (ESD) PROTECTION CLAMP TECHNOLOGY

(71) Applicant: SEMICONDUCTOR COMPONENTS INDUSTRIES, LLC, Phoenix, AZ (US)

(72) Inventors: Mario M. Pelella, Mountain View, CA (US); Stephanie Marie Bohaichuk, Palo Alto, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 319 days.

(21) Appl. No.: 16/125,839

(22) Filed: Sep. 10, 2018

(65) Prior Publication Data

US 2019/0097419 A1    Mar. 28, 2019

Related U.S. Application Data

(60) Provisional application No. 62/564,118, filed on Sep. 27, 2017.

(51) Int. Cl.
| | |
|---|---|
| *H02H 9/04* | (2006.01) |
| *H01L 23/60* | (2006.01) |
| *H01L 27/02* | (2006.01) |
| *H01L 23/525* | (2006.01) |

(52) U.S. Cl.
CPC ............ *H02H 9/046* (2013.01); *H01L 23/60* (2013.01); *H01L 27/0251* (2013.01); *H01L 27/0288* (2013.01); *H01L 23/5252* (2013.01); *H01L 23/5256* (2013.01); *H01L 2924/1305* (2013.01); *H01L 2924/13062* (2013.01); *H01L 2924/13091* (2013.01); *H01L 2924/1433* (2013.01)

(58) Field of Classification Search
CPC ...... H02H 9/046; H01L 23/60; H01L 27/0251
See application file for complete search history.

(56) References Cited

U.S. PATENT DOCUMENTS

| | | | | |
|---|---|---|---|---|
| 3,621,446 A | * | 11/1971 | Smith | H01C 7/047 338/23 |
| 8,035,224 B2 | * | 10/2011 | Poeppel | H01L 23/647 257/724 |
| 9,722,418 B2 | * | 8/2017 | Kang | H02H 9/044 |
| 2005/0201575 A1 | * | 9/2005 | Koshida | H04R 23/002 381/164 |
| 2009/0208639 A1 | * | 8/2009 | Yun | H01L 49/003 427/126.3 |
| 2012/0152014 A1 | * | 6/2012 | Speldrich | G01F 1/6845 73/204.23 |
| 2013/0314825 A1 | | 11/2013 | Bajaj et al. | |
| 2014/0285933 A1 | | 9/2014 | Kim et al. | |

OTHER PUBLICATIONS

B. Kim, et al., "VO2 Thin Film Varistor Based on Metal-Insulator Transition," IEEE Electron Device Letters, 31, 1, 14 (2010).

* cited by examiner

*Primary Examiner* — Scott Bauer
(74) *Attorney, Agent, or Firm* — Brake Hughes Bellermann LLP

(57) ABSTRACT

In some implementations, an apparatus can include a semiconductor region including an electrical device and a back-end region disposed on the semiconductor region. The back-end region can include a first terminal and a second terminal. The apparatus can include an insulator-metal transition (IMT) material electrically coupled between the first terminal and the second terminal.

19 Claims, 7 Drawing Sheets

ELECTRO-STATIC DISCHARGE (ESD) PROTECTION CLAMP TECHNOLOGY

CROSS REFERENCE TO RELATED APPLICATION

This application claims priority to and the benefit of U.S. Provisional Application No. 62/564,118, filed Sep. 27, 2017, which is incorporated by reference herein in its entirety.

TECHNICAL FIELD

This description relates to electro-static discharge (ESD) protection clamp technology.

BACKGROUND

Electrostatic discharge (ESD) created during production and assembly of a device can cause an enormous voltage spike through pins on a die. Such ESD can cause permanent damage to the device. Some ESD solutions can occupy a significant amount of space (e.g., more than 20% of silicon space), which can be undesirable, within the device. Thus, a need exists for systems, methods, and apparatus to address the shortfalls of present technology and to provide other new and innovative features.

SUMMARY

In some implementations, an apparatus can include a semiconductor region including an electrical device and a back-end region disposed on the semiconductor region. The back-end region can include a first terminal and a second terminal. The apparatus can include an insulator-metal transition (IMT) material electrically coupled between the first terminal and the second terminal.

The details of one or more implementations are set forth in the accompanying drawings and the description below. Other features will be apparent from the description and drawings, and from the claims.

DETAILED DESCRIPTION

Electrostatic discharge (ESD) created during production, assembly, and/or use of a system including an electronic device (e.g., a semiconductor device, a chip, an electronic circuit) can cause a voltage spike between terminals (e.g., one or more supply terminals, a ground terminal) of the electronic circuit. The ESD devices (also can be referred to as ESD clamp devices) described herein can be used to prevent these types of ESD events that can damage the electronic device in an undesirable fashion. The ESD devices can be configured to reduce or prevent ESD events from destroying an electronic device and/or rendering the electronic device inoperable. In other words, the ESD devices can be configured to provide ESD protection to an electronic device within a system. The ESD devices can be relatively small in size (e.g., less than 20% of the silicon on a die), which can be desirable. Such relatively small ESD devices can reduce production costs and can result in the overall reduction in cost of a device.

The ESD devices described herein can include a material with an insulator-metal transition (IMT) (also can be referred to as an IMT material). The use of an IMT material can result in the ESD device (and protection) being included in a back-end region (e.g., a back-end of line region, a back-end portion) of a system rather than a front-end region (e.g., a front-end of line region, a semiconductor region) of the system. By including the ESD device in the back-end region, the space (e.g., die space) of the semiconductor region is not utilized for ESD protection. Specifically, ESD devices can include a two-terminal device made of an insulator-metal transition (IMT) material (e.g., $VO_2$, niobium dioxide ($NbO_2$)). The IMT material can be produced during back-end region (e.g., metal level) chip fabrication. In some implementations, the IMT material within the ESD device can be configured to change to a conductive (e.g., metallic) material when the voltage between a pair of terminals (e.g., two pins) exceeds a target operating voltage (e.g., a target operating voltage), either positive or negative, in response to an ESD event. The material can be configured to return to an insulating material once the ESD event has passed.

Figure 1A:
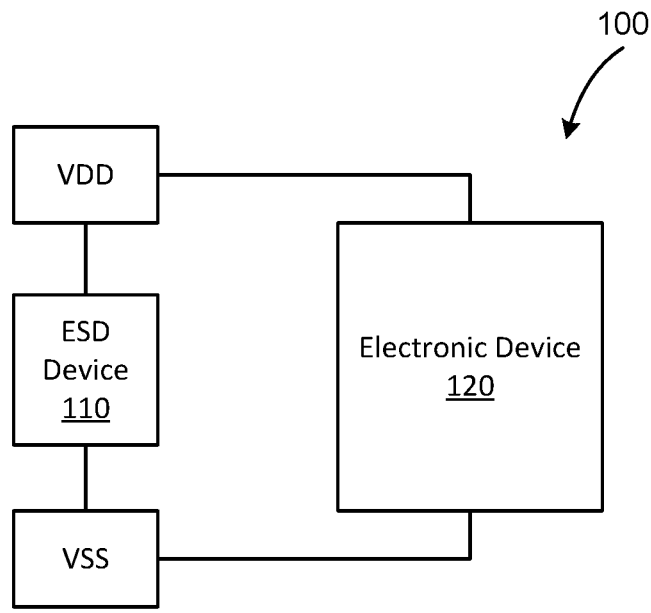
FIG. 1A is a schematic circuit diagram that illustrates a system including an ESD device and an electronic device.

FIG. 1A is a schematic circuit diagram that illustrates a system 100 including an ESD device 110 and an electronic device 120. As shown in FIG. 1, the ESD device 110 is disposed between a VDD terminal (e.g., a first terminal) and a VSS terminal (e.g., a second terminal). The ESD device 110 can define a conductive path parallel to the electronic device 120 to protect the electronic device 120 from an ESD event. Specifically, the ESD device 110 can shunt power away from the electronic device 120 during an ESD event. The electronic device 120 can include, for example, a metal-oxide semiconductor field effect transistor (MOSFET) device (e.g., a vertical MOSFET device, a horizontal or lateral MOSFET device), a bi-polar junction transistor (BJT) device, a diode, a resistor, a junction field effect transistor (JFET) device, an integrated circuit, an application-specific integrated circuit (ASIC), and/or so forth.

In response, to a voltage between the VDD terminal and the VSS terminal exceeding a threshold voltage, the ESD device 110 can be configured to change from an insulating state to a conducting state. When a voltage between the VDD terminal and the VSS terminal is less than the threshold voltage, the ESD device 110 can be configured to change from the conducting state to the insulating state. In some implementations, the insulating state can be a relatively insulating state and the conducting state can be a relatively conductive state. The default state of the ESD device 110 can be an insulating state.

The ESD device 110 includes a material with an insulator-metal transition (IMT). The IMT material can enable the ESD device 110 to change between the insulating state and the conducting state. The IMT material within the ESD device 110 can be configured to change to a conductive (e.g., metallic) material when the voltage between the VDD terminal and the VSS terminal exceeds an ESD threshold voltage of the electronic device 120, either positive or negative, in response to an ESD event. The IMT material can be configured to return to an insulating material (or state) within the ESD device 110 once the ESD event has passed (and the voltage falls below the ESD threshold voltage).

In some implementations, the ESD threshold voltage can be outside of a target operating voltage range of the electronic device 120. In some implementations, the ESD threshold voltage can be greater than an upper target operating voltage of the electronic device 120.

The IMT material can be included in a back-end region (e.g., a back-end of line region, a back-end portion) of the system 100 rather than a front-end region (e.g., a front-end of line region, a semiconductor region) of the system 100. Accordingly, the use of an IMT material can result in the ESD device 110 being included in a back-end region of the system 100 rather than a front-end region of the system 100. By including the ESD device 110 in the back-end region, area (e.g., die space) of the semiconductor region is not utilized for ESD protection. In some implementations, including ESD device in the back-end region can make significant space in a semiconductor region within a semiconductor die available. The additional space can enable increased functionality in a semiconductor die through additional circuitry, and/or a significant reduction in cost in manufacturing by allowing for more, smaller die per wafer. In some implementations, including an ESD device 110 within the back-end portion and relatively close to the actual event origin (the terminals exposed to an external device) can enhance response time and overall ESD protection of the ESD device 110. As noted above, the ESD devices 110 can be, or can include, a two-terminal device made of an insulator-metal transition (IMT) material (e.g., $VO_2$, $NbO_2$).

Figure 1B:
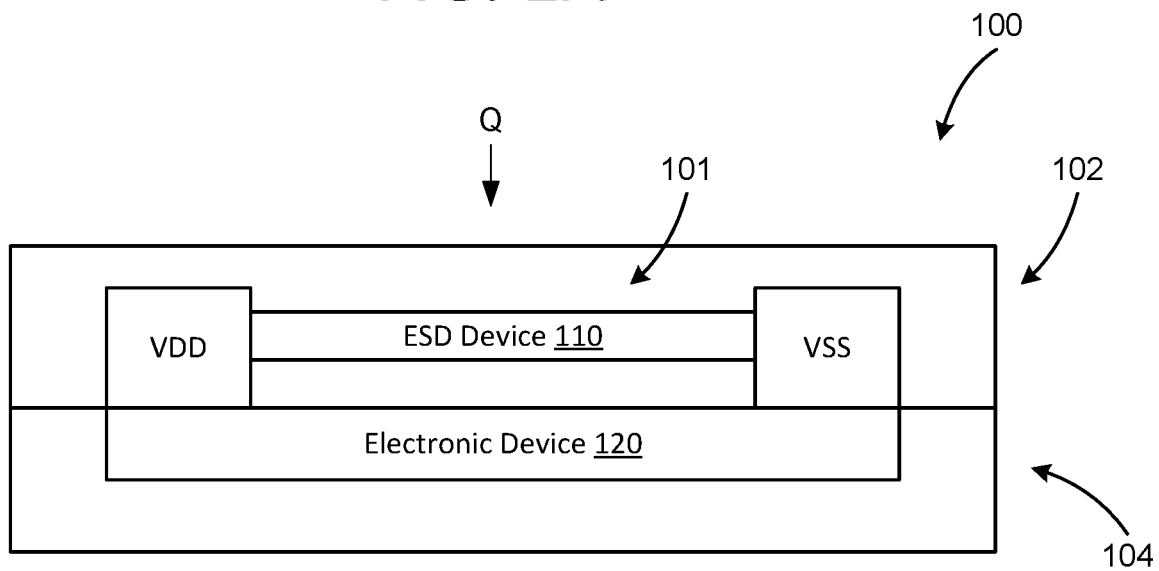
FIG. 1B is a diagram that illustrates a side-cross sectional representation of the ESD device included in the system shown in FIG. 1A.

FIG. 1B is a diagram that illustrates a side-cross sectional representation of the ESD device 110 included in the system 100 shown in FIG. 1A. FIG. 1B illustrates an example physical implementation of the circuit representation of the system 100 shown in FIG. 1A. As shown in FIG. 1B, the system 100 includes an ESD device 110 electrically coupled between a VDD terminal and an VSS terminal. Specifically, the ESD device 110 is electrically and physically coupled to the VDD terminal and the ESD device 110 is electrically and physically coupled to the VSS terminal.

The ESD device 110, the VSS terminal, and the VDD terminal are disposed in a back-end region 102 of the system 100. The back-end region 102 can include, for example, metal layers, insulating layers, vias, and/or so forth. The back-end region 102 can be formed on (e.g., disposed on) a semiconductor region 104.

As shown in FIG. 1B, the ESD device 110 is included within an insulator 101 (e.g., a dielectric (e.g., a low-k dielectric), an oxide) between the VSS terminal and the VDD terminal. The ESD device 110 is disposed between a first portion of the insulator 101 and a second portion of the insulator 101.

The electronic device 120 is formed in (e.g., disposed in) the semiconductor region 104. The semiconductor region 104 can include a semiconductor substrate (e.g., a silicon substrate, a gallium nitride substrate), an epitaxial layer formed on (e.g., disposed on) a semiconductor substrate.

Although not explicitly shown in FIG. 1B, the ESD device 110 includes an IMT material. The IMT material within the ESD device 110 changes to a conductive (e.g., metallic) material when the voltage between the VDD terminal and the VSS terminal exceeds an ESD threshold voltage, and the IMT material returns to an insulating material (or state) in response to the voltage falling below the ESD threshold voltage. A voltage at which the IMT material changes state from a conductive material (or state) to an insulating material (or state) can be referred to as a trigger voltage. Accordingly, the ESD device 110 can be configured to that the trigger voltage of the ESD device 110 is above the ESD threshold voltage (and/or) outside of a target operating voltage range of the electronic device 120.

Figure 2:
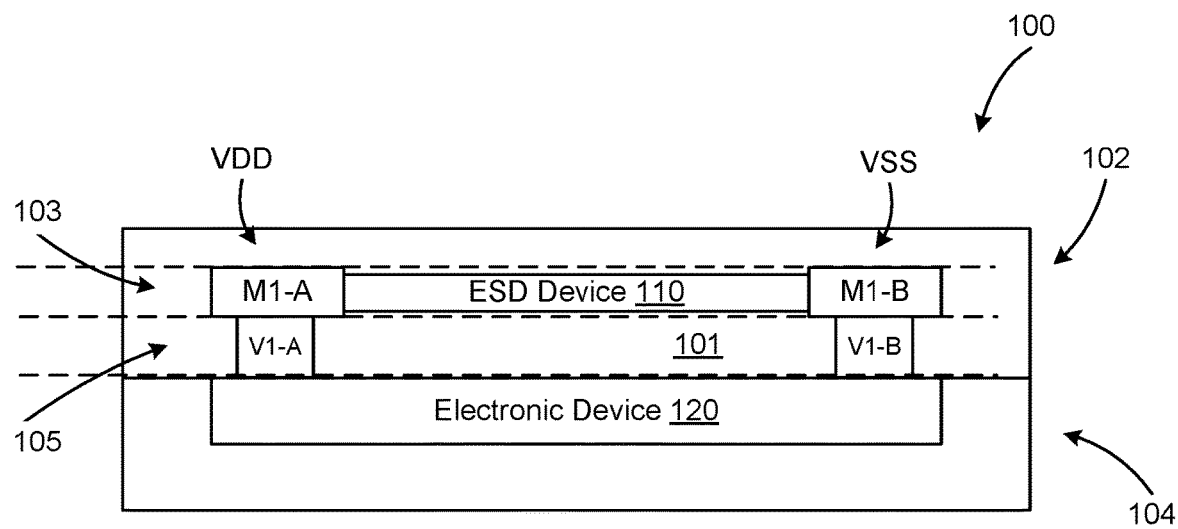
FIGS. 2 through 4 illustrate variations of the system shown in FIG. 1B.

The ESD device 110 (or a portion thereof) can be included in a metal layer (e.g., metal layer 1 (M1), metal layer 2 (M2)) or within a via layer. FIG. 2 illustrates a variation of the system 100 shown in FIG. 1B. In this example implementation, the ESD device 110 is included in a metal layer 103 that includes metal portions M1-A (associated with VDD) and M1-B (associated with VSS). A via layer 105 includes via V1-A (associated with VDD) and V1-B (associated with VSS).

Figure 3:
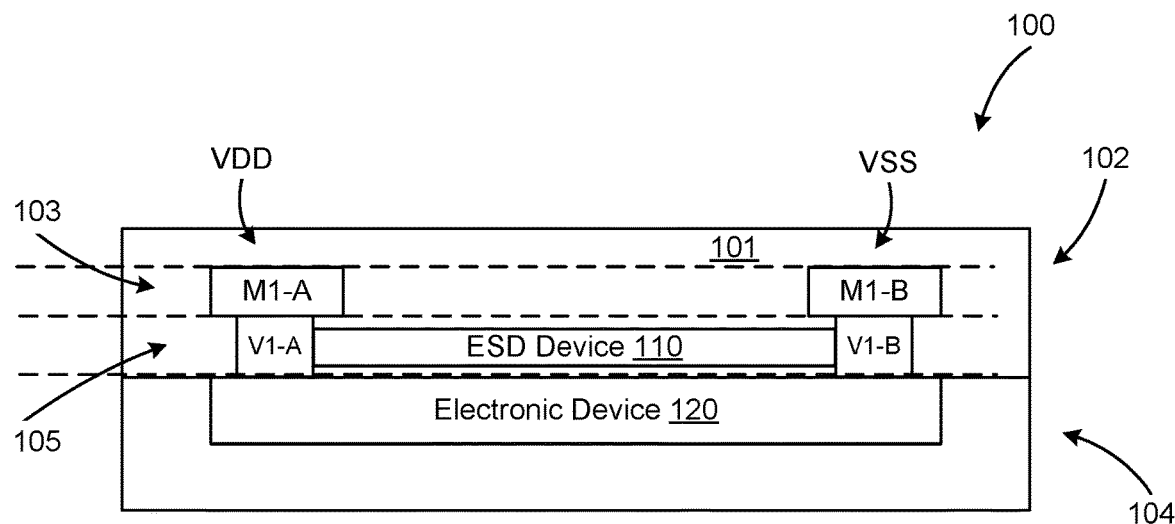

FIG. 3 illustrates another variation of the system 100 shown in FIG. 1B. In this example implementation, the ESD device 110 is included in the via layer 105.

Figure 4:
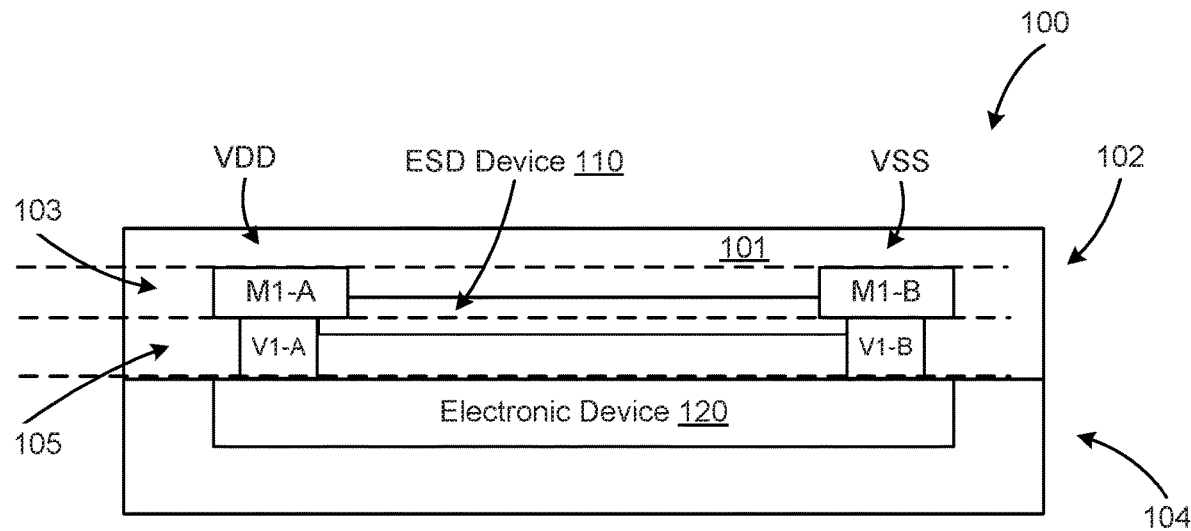

FIG. 4 illustrates yet another variation of the system 100 shown in FIG. 1B. In this example implementation, a first portion of the ESD device 110 is included in the metal layer 103 and a second portion of the ESD device 110 is included in the via layer 105.

Figure 5:
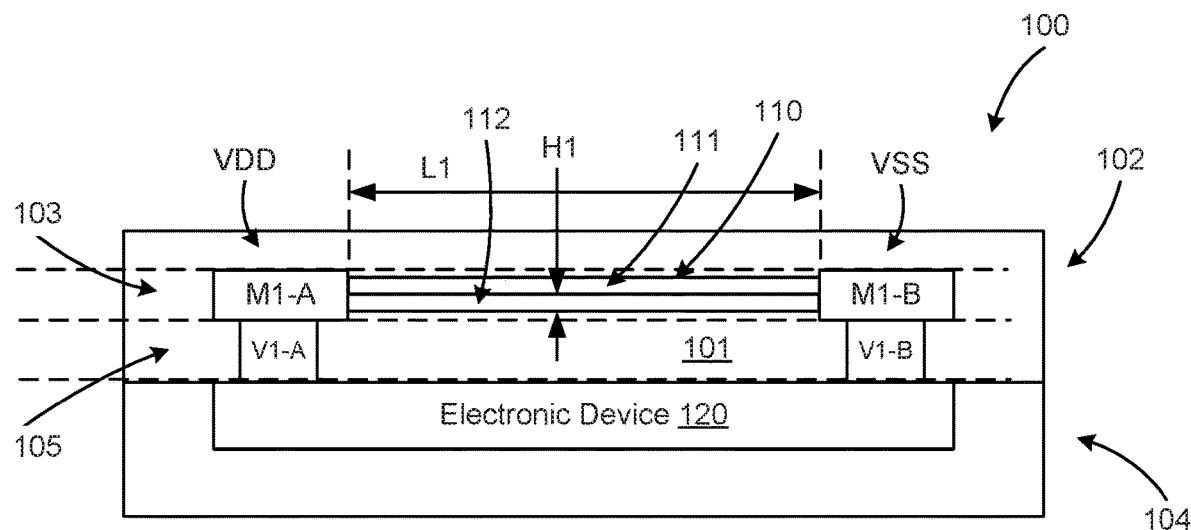
FIG. 5 illustrate another variation of the system shown in FIG. 1B that includes a heat spreader.

FIG. 5 illustrates yet another variation of the system 100 shown in FIG. 1B that includes a heat spreader. As shown in FIG. 5, the ESD device 110 includes a heat spreader 111 and an IMT material 112. The heat spreader 111 is coupled to the IMT material 112 of the ESD device 110.

In some implementations, since Joule heating can have a relatively large role in initiating the IMT material 112, the trigger voltage of the IMT material 112 can be further increased by surrounding the material with high thermal conductivity materials such as the heat spreader 111. In some implementations, the trigger voltage and/or reliability ESD device 110 can be increased by using the heat spreader 111. The heat spreader 111 can be configured to thermally conduct heat away from the IMT material 112 of the ESD device 110. The heat spreader 111 can be a relatively high thermal conductivity material. The heat spreader 111 can be adjacent to the IMT material 112.

In some implementations, the heat spreader 111 can be, or can include, an electrical insulator such as aluminum oxide ($Al_2O_3$) and/or silicon nitride ($Si_3N_4$). In some implementations, the heat spreader 111 can be, or can include, a material different from silicon dioxide ($SiO_2$). In some implementations, the heat spreader 111 can be coupled to, adjacent to, or can include a metal layer (not shown).

In some implementations, the heat spreader 111 can also increase reliability of the ESD device 110 during ESD events. Since many failure mechanisms can be rapidly accelerated by higher temperatures, the heat spreader 111 can conduct heat away from the IMT material 112. In some implementations, heat spreader 111 can allow better dissipation of the enormous power generated during an ESD event. In some implementations, the IMT material 112 and the heat spreader 111 can be coupled with a clean interface with a low thermal boundary resistance between the heat spreader 111 and the IMT material 112. The heat spreader 111 can be made of a relatively electrically insulating material (e.g., insulating such as an oxide) and a thermally conductive material (e.g., thermally conductive like a metallic material).

In some implementations, since Joule heating can have a relatively large role in initiating the IMT material 112, the trigger voltage of the ESD device 110 can be further increased by increasing the resistivity of the IMT material 112 in the insulating state. In some implementations, the resistivity of the IMT material 112 can be increased in the insulating state through growth conditions and/or post-growth treatments.

The IMT material 112 can be produced using a variety of methods. For example, an IMT material 112 can be deposited using pulsed laser deposition, sputtering, molecular beam epitaxy, oxidation of vanadium, atomic layer deposition, and/or so forth. In some implementations, the electrical properties of an IMT material 112 (e.g., vanadium dioxide ($VO_2$)) can be sensitive to film stoichiometry, strain, defect concentration, and/or grain structure. In some implementations, one or more of these properties can be modified (e.g., tuned) via the substrate type, deposition temperature, oxygen pressure, and/or using post-deposition annealing. In some implementations, the resistivity of the IMT material 112 in the insulating state (e.g., phase) can also be determined by similar factors and can be increased by adjusting the strain, increasing oxygen content, and/or by changing growth temperature. In some implementations, depositions can be performed using, for example, a $VO_2$ target or reactively with a vanadium (V) target, using oxygen presence in either case to obtain a target $VO_2$ stoichiometry. In some implementations, depositions and/or post-deposition anneals can be performed with an elevated substrate temperature, between, for example, 300° C.-600° C., to, for example, adjust stoichiometry and/or achieve relatively large crystal grains.

In the implementation shown in FIG. 5, the heat spreader 111 is disposed above the IMT material 112 (in a vertical stack). In other words, the IMT material 112 is disposed between the heat spreader 111 and the semiconductor region 104 (and the electronic device 120). Although not shown, in some implementations, a heat spreader can be disposed below the IMT material 112. In other words, the heat spreader can be disposed between the IMT material 112 and the semiconductor region 104 (and the electronic device 120).

In some implementations, an ESD device (such as ESD device 110) can include one or more IMT material layers and one or more heat spreader layers in a vertical stack. For example, an ESD device can include two heat spreader layers and two IMT material layers that are interleaved in a vertical stack.

In some implementations, a trigger voltage of the ESD device 110 can be set (e.g., determined) by a length L1 of the ESD device 110. In some implementations, the trigger voltage of the IMT material 112 can scale linearly with length. The length L1 can be adjusted for a particular ESD device 110 (and pin combination or pair) so that the trigger voltage of the ESD device 110 is larger than, for example, an operating voltage or ESD voltage of the ESD device 110. The principles related to length and trigger voltage can be applied to any of the implementations described herein. The trigger voltage of the ESD device 110 can be defined based on a height H1 of IMT material 112 in the ESD device 110.

Figure 6:
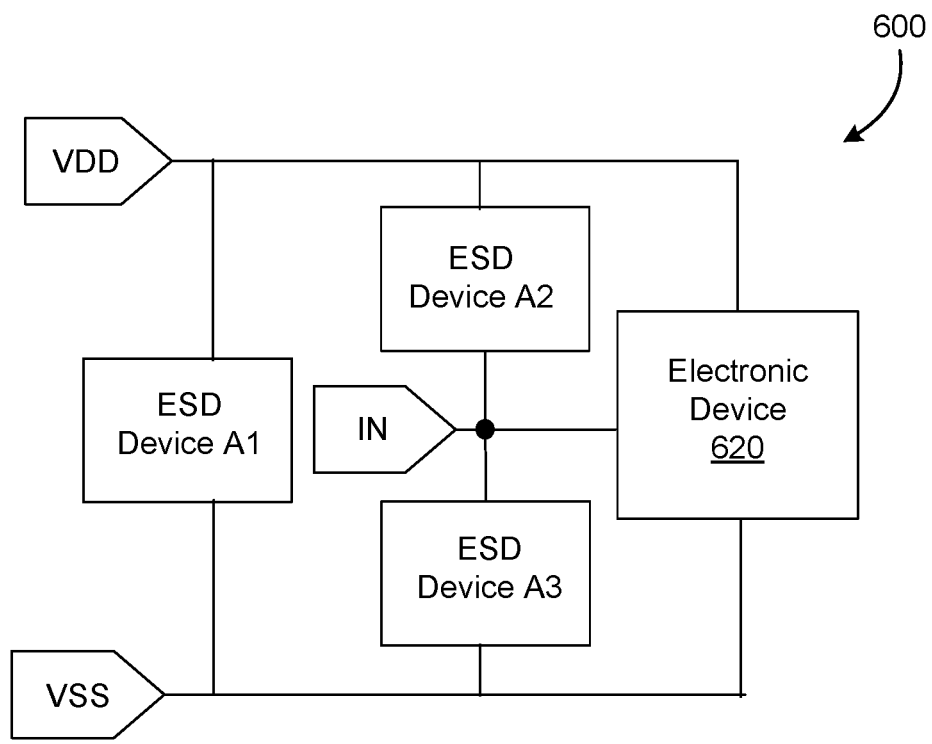
FIG. 6 is a schematic circuit diagram that illustrates a system including multiple ESD devices.

FIG. 6 is a schematic circuit diagram that illustrates a system 600 including multiple ESD devices. The system 600 shown in FIG. 6 is a variation of the system 100 shown in FIG. 1A. The system 600 includes ESD devices A1 through A3 and an electronic device 620. One or more of the ESD devices A1 through A3 can include an IMT material. One or more of the ESD devices A1 through A3 can be included in a back-end region of the system 600.

As shown in FIG. 6, the ESD device A1 is disposed between a VDD terminal (e.g., a first terminal) and a VSS terminal (e.g., a second terminal). The ESD device A2 is disposed between the VDD terminal and an IN terminal (e.g., a third terminal). The ESD device A3 is disposed between the VSS terminal and the IN terminal. In some implementations, one or more of the ESD devices A1 through A3 can be associated with one or more portions of the electronic device 620.

The ESD devices A1 through A3 define conductive paths parallel to the electronic device 620 between different nodes of the system 600 to protect the electronic device 620 from different types of ESD events. Specifically, the ESD device A1 can shunt power away from the electronic device 620 during an ESD event between the VDD and VSS terminals. The ESD device A2 can shunt power away from the electronic device 620 during an ESD event between the VDD and IN terminals, and the ESD device A3 can shunt power away from the electronic device 620 during an ESD event between the VSS and IN terminals.

The ESD devices A1 through A3 can have different trigger voltages. For example, the ESD device A1 can each have a trigger voltage greater than the trigger voltage of ESD device A2 and/or the ESD device A3. The ESD device A2 can have a trigger voltage greater than, equal to, or less than the trigger voltage of ESD device A3. The trigger voltages of the ESD devices A1 through A3 can be defined by a length of an IMT material included in the ESD devices A1 through A3 (with a greater length defining a higher trigger voltage).

Figure 7:
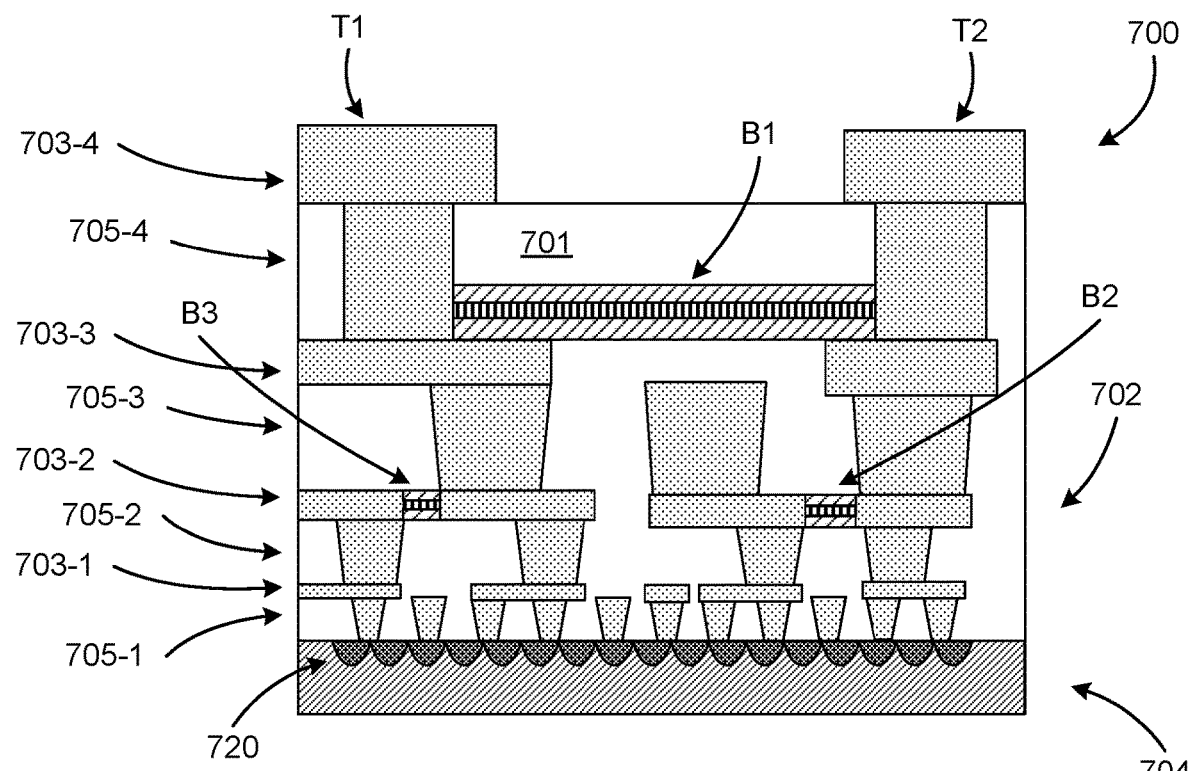
FIG. 7 is a side cross-sectional view of at least one implementation of a system.

FIG. 7 is a side cross-sectional view of at least one implementation of a system 700. The system 700 has a back-end region 702 including ESD devices B1 through B3 and a semiconductor region 704 including an electronic device 720. In this implementation, the back-end region 720 includes insulating layers 701, metal layers 703-1 through 703-4, and via layers 705-1 through 705-4. The size (e.g., thickness, height, volume) of the metal layers 703 can increase from the lower metal layer 703-1 to the upper metal layer 703-4. The system 700 includes terminals T1 and T2 (which are externally accessible via metal layer 703-4) as well as other intermediate node points within the back-end region 702.

As shown in FIG. 7, the ESD device B1 is disposed within via layer 705-4 between terminals T1 and T2. The ESD devices B2 and B3 are disposed within via layer 705-4 and are electrically coupled to terminals T1 and T2, respectively. As shown in FIG. 7, the ESD devices B1 through B3 include an IMT material disposed between heat spreaders (a first one on top and a second one on bottom). In this implementation, the length of each of the ESD devices B1 through B3 is different so that the trigger voltages of each of the ESD devices B1 through B3 is different.

Figure 8:
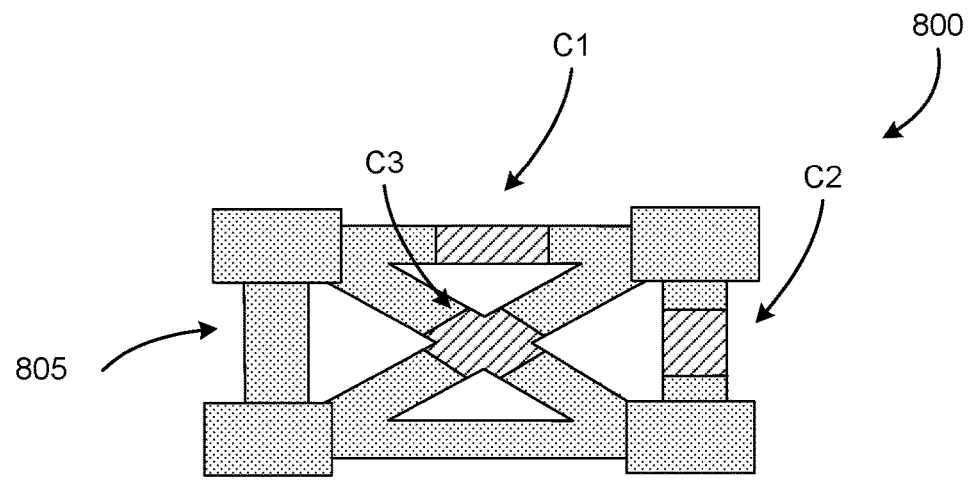
FIG. 8 is a top view of at least one implementation of a system.

FIG. 8 is a top (or plan) view of at least one implementation of a system 800. As shown in FIG. 8, the system includes ESD devices C1 through C3 within a metal layer 803. The ESD devices C2 and C3 have rectangular profile or shape when viewed from above. The ESD devices C1 has a non-rectangular profile or shape. The ESD devices described herein can have a variety of profiles or shapes (e.g., curved, irregular) when viewed from above.

Figure 9:
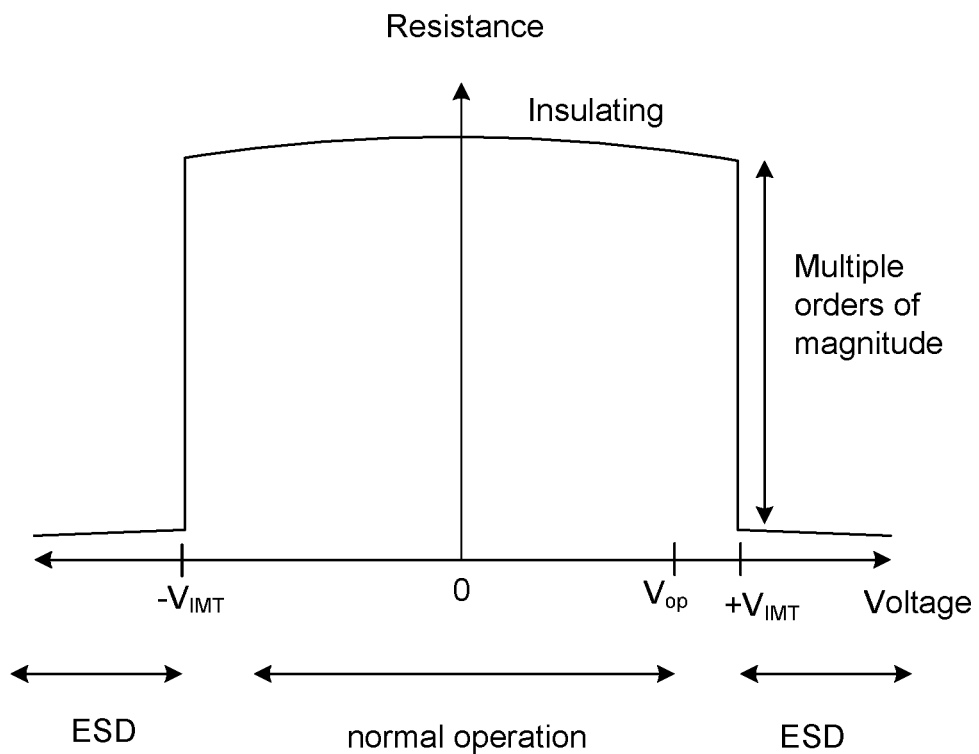
FIG. 9 is graph that illustrates operation of at least one of the ESD device implementations described herein.

FIG. 9 is graph that illustrates operation of at least one of the ESD device implementations (e.g., ESD device 110 shown in FIG. 1A) described herein. In some implementations, materials such as $VO_2$ or $NbO_2$ undergo a reversible insulator to metal transition at a critical temperature or voltage, with a change in resistivity spanning multiple orders of magnitude. In some implementations, the IMT trigger voltage ($V_{IMT}$) can be designed to be larger than the operating voltage of the electronic devices (e.g., circuits) on a semiconductor die ($V_{op}$), so that the IMT material can be used to protect against an ESD event. In some implementations, the IMT material will be insulating and conducting (e.g., metallic) in response to any voltage across the IMT material spiking larger than $|V_{IMT}|$, either positive or negative. After the ESD event is completed, the IMT material will return to insulating. This behavior is illustrated in FIG. 9.

The implementations described herein can be contrasted with examples of current ESD protection used between pins including, for example, diodes, various configurations of NMOS devices, or a silicon-controlled rectifier made using BJTs. The implementations described herein may be different than designs that turn metallic and carry high currents when an ESD event occurs. The implementations described herein may also differ from designs having main components disposed in a front-end region (e.g., front-end of line processing).

In some implementations, incorporating IMT material within a back-end of line (BEOL) ESD device can result in a significant saving of on-die area by replacing conventional front-end of line (FEOL) ESD devices. In some implementations, the IMT material can be deposited and/or patterned as a thin film in one of the last layers (e.g., within back-end region, metal layers) on a semiconductor die. In some implementations, in addition to saving space, the implementations described herein have the advantage of restricting the high currents and/or heating during ESD events to upper levels away from the more sensitive gate oxides and thin metal lines, improving reliability. In some implementations, lines of IMT material can be disposed between the various pin combinations in the upper metal layers (e.g., above metal 2 (M2)). In some implementations, additional protection can be included by adding IMT material at lower metal levels (e.g., below metal 3 (M3)).

Figure 10:
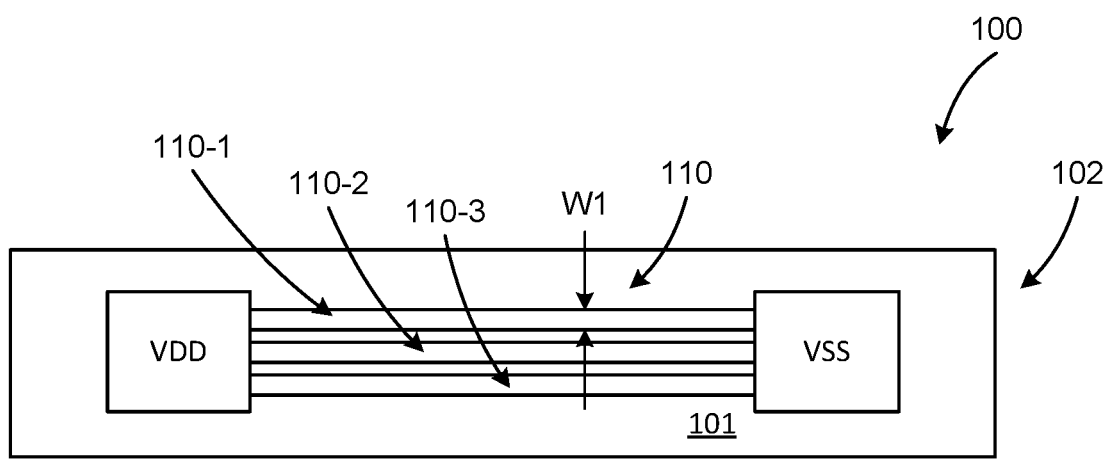
FIG. 10 is a diagram that illustrates a top view of a variation of the ESD device 110 shown in FIG. 1B.

FIG. 10 is a diagram that illustrates a top view of a variation of the ESD device 110 shown in FIG. 1B. The top view of the ESD device 110 shown in FIG. 10 is viewed from the direction Q shown in FIG. 1B. As shown in FIG. 10, the ESD device 110 includes multiple parallel stripes 110-1 through 110-3. Each of the stripes can include one or more IMT material layers and one or more heat spreader layers (not shown). In some implementations, electromigration in the ESD device 110 during an ESD event can be reduced by using multiple parallel stripes. In some implementations, electromigration (particularly motion of oxygen vacancies along grain boundaries oriented parallel to the current path) can be a failure mechanism, and can be reduced by improving material purity and/or by controlling geometry and grain size/orientation.

As a specific example, in some implementations, electromigration within the ESD device 110 during an ESD event can be reduced if a width W1 (and/or height (not shown)) of at least one of the multiple parallel stripes is on the order of or smaller than a grain size of the IMT material. Although not shown in FIG. 10, in some implementations, electromigration within an ESD device (e.g., ESD device 110) during an ESD event can be reduced if a width (and/or height) of the ESD device (without parallel stripes) is on the order of or smaller than a grain size of the IMT material.

Figure 11:
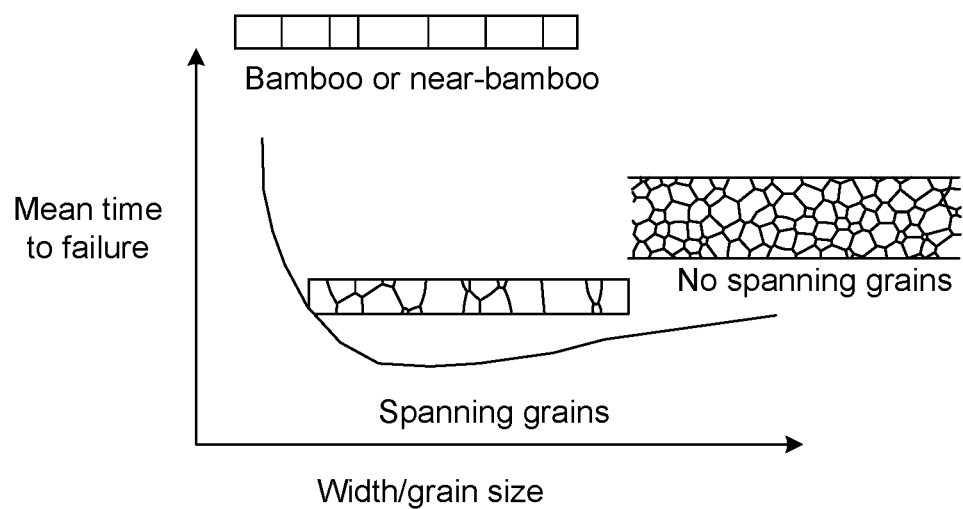
FIG. 11 is a graph that illustrates a mean time to failure of an IMT material as a function of width/grain size.

In some implementations, reliability can be improved if the IMT material is divided into relatively small stripes (e.g., small cross-sectional area stripes) with a width and/or height on the order of the grain size. In some implementations, a larger grained material (e.g., by annealing the IMT material as an annealed IMT material). In some implementations, a single crystal can also be used as an IMT material. In some implementations, annealing of an ESD device (to anneal the IMT material into an annealed IMT material) can limit the number of grain boundaries available for electromigration, and can add surface area for heat spreading. FIG. 11 is a graph that illustrates a mean time to failure of an IMT material as a function of width/grain size. An ESD device (e.g., ESD device 110) can have an IMT material defined to reduce (e.g., minimize) a mean time to failure).

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Implementations may be implemented in a computing system that includes a back end component, e.g., as a data server, or that includes a middleware component, e.g., an application server, or that includes a front end component, e.g., a client computer having a graphical user interface or a Web browser through which a user can interact with an implementation, or any combination of such back end, middleware, or front end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
   a semiconductor substrate having an epitaxial layer including an electrical device; and
   a back-end region formed on the semiconductor substrate, the back-end region including:
   a first terminal;
   a second terminal; and
   an insulator-metal transition (IMT) material electrically coupled between the first terminal and the second terminal, the IMT material is produced during semiconductor processing of the back-end region on the semiconductor substrate.

2. The apparatus of claim 1, wherein the IMT material is included in an electro-static discharge (ESD) device electrically coupled between the first terminal and the second terminal.

3. The apparatus of claim 1, wherein the IMT material is $VO_2$ or $NbO_2$.

4. The apparatus of claim 1, wherein the IMT material has a trigger voltage larger than a target operating voltage of the electrical device.

5. The apparatus of claim 1, wherein the IMT material changes to a metallic material when a voltage exceeds an absolute value of an operating voltage of the electrical device, the IMT material changes to an insulating material when a voltage is less than an absolute value of the operating voltage of the electrical device.

6. The apparatus of claim 1, wherein IMT material is an annealed IMT material.

7. The apparatus of claim 1, further comprising:
   a heat spreader coupled to the IMT material and included in the back-end region.

8. The apparatus of claim 1, wherein the IMT material is defined as a plurality of stripes with at least one of a width or a height on the order of a grain size of the IMT material.

9. An apparatus, comprising:
   a first terminal;
   a second terminal; and
   an electro-static discharge (ESD) device electrically coupled between the first terminal and the second terminal, the ESD device including:
   an insulator-metal transition (IMT) material; and
   a heat spreader material coupled to the IMT material, the IMT material has at least one of a width or a height on the order of a grain size of the IMT material.

10. The apparatus of claim 9, wherein the heat spreader is a first heat spreader, the ESD device including a second heat spreader.

11. The apparatus of claim 9, comprising:
    a semiconductor region including an electrical device; and
    a back-end region disposed on the semiconductor region, the back-end region including the ESD device.

12. The apparatus of claim 9, wherein the heat spreader includes an electrically insulating material and a thermally conductive material.

13. The apparatus of claim 9, wherein the heat spreader is made of an insulating material including $Al_2O_3$.

14. The apparatus of claim 9, wherein the heat spreader is made of an insulating material including $Si_3N_4$.

15. The apparatus of claim 9, wherein the IMT material is $VO_2$ or $NbO_2$.

16. An apparatus, comprising:
    a first terminal;
    a second terminal; and
    a first electro-static discharge (ESD) device electrically coupled between the first terminal and the second terminal, the first ESD device including a first insulator-metal transition (IMT) material and included in a first layer of a back-end region of a semiconductor device; and
    a second electro-static discharge (ESD) device including a second (IMT) material, the second ESD device being in a second layer of the back-end region of the semiconductor device, the first layer being different than the second layer.

17. The apparatus of claim 16, wherein the first layer is a first metal layer and the second layer is an insulator layer or a second metal layer.

18. The apparatus of claim 16, further comprising:
    a semiconductor region including an electrical device, the back-end region being coupled to the semiconductor region.

19. The apparatus of claim 16, further comprising:
    a heat spreader coupled to the first IMT material.

* * * * *